United States Patent [19]

Josephs

[11] 4,229,806
[45] Oct. 21, 1980

[54] CONSECUTIVE BIT BUBBLE MEMORY DETECTOR

[75] Inventor: Richard M. Josephs, Willow Grove, Pa.

[73] Assignee: Sperry Corporation, New York, N.Y.

[21] Appl. No.: 43,278

[22] Filed: May 29, 1979

[51] Int. Cl.³ .............................................. G11C 19/08
[52] U.S. Cl. ........................................ 365/8; 365/43
[58] Field of Search .................................. 365/8, 43

[56] References Cited

U.S. PATENT DOCUMENTS

| | | | |
|---|---|---|---|
| 3,810,132 | 5/1974 | Bobeck | 365/43 |
| 3,953,840 | 4/1976 | Cutler et al. | 365/43 |
| 4,058,799 | 11/1977 | George et al. | 365/16 |

OTHER PUBLICATIONS

IBM Technical Disclosure Bulletin-vol. 19; No. 7, Dec. 1976, pp. 2797-2799.

*Primary Examiner*—James W. Moffitt
*Attorney, Agent, or Firm*—John B. Sowell; W. E. Cleaver; M. M. Truex

[57] ABSTRACT

Consecutive bit bubble memory devices employ a dummy detector element separated from the detector element. This arrangement causes substantial background magnetoresistor noise. The dummy detector of the present invention is located in a novel dummy array which minimizes the magnetoresistor noise, enhances the signal-to-noise ratio and enables the detection of bubble domains without error.

10 Claims, 10 Drawing Figures

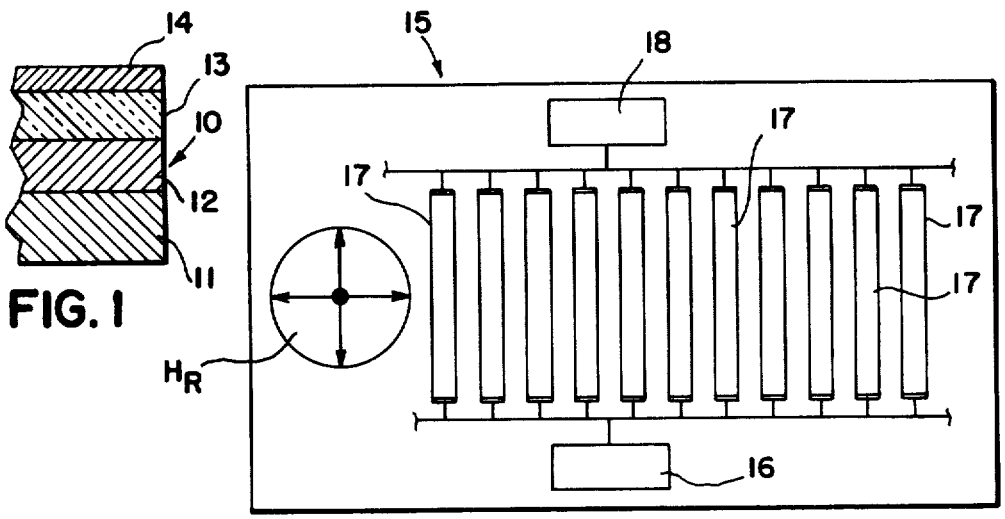
FIG. 1
FIG. 2
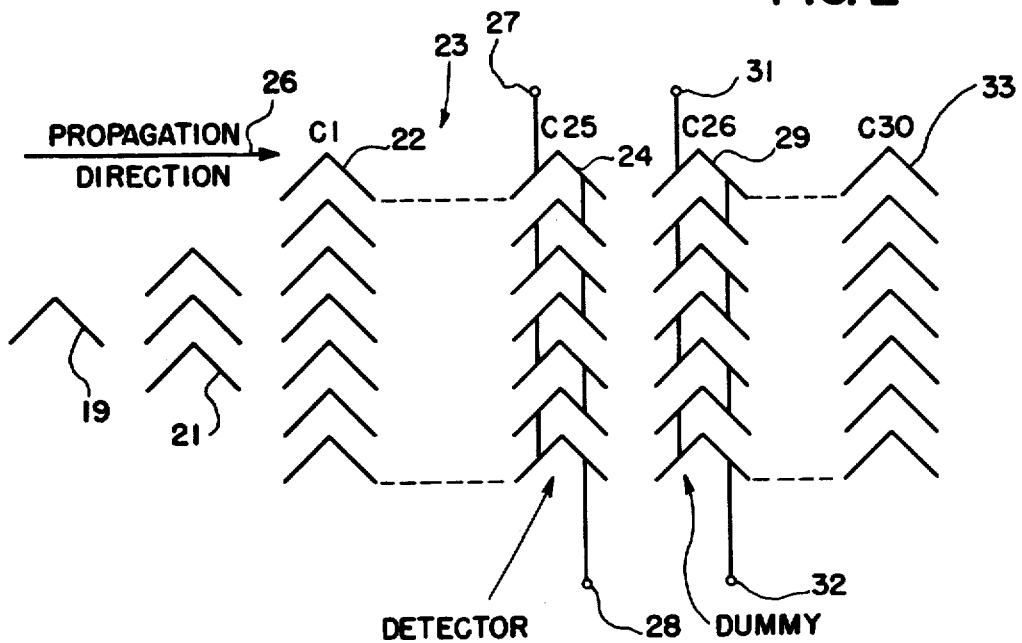
FIG. 3 (PRIOR ART)

CONSECUTIVE BIT BUBBLE MEMORY DETECTOR

BACKGROUND OF THE INVENTION

1. Field of the Invention

The present invention is related to bubble memory devices. More particularly, the present invention is related to an improved detector device for a thick film single layer bubble memory which is arranged to detect continuous bit bubble streams.

2. Description of the Prior Art

Prior art bubble memory devices are well-known and are generally classified in U.S. Class 340, subclass 174 (International Class G11C 11/14).

Prior art thick bubble memory devices such as Model TIB0203 and TIB0303 are thick film devices manufactured by Texas Instrument Company and employ a plurality of storage loops for storing bubble domains. When the information represented by the bubble stream is to be retrieved from one of the individual storage loops, the stream is diverted or replicated through a detector array.

The voltage signal which is produced by a single bubble domain passing through a detector stage is very weak and it has become a desired practice to enlarge the bubble domain into a large elongated domain to increase the voltage response in the detector. A typical prior art chevron-shaped pattern expanding stage has been employed before entering a detector stage and such expanding stages are shown in U.S. Pat. No. 3,953,840. The detector stage in this patent is similar to the detector stage employed in the TIB0203 bubble memory device and such detectors have generally been classified as alternate bit detectors because the stream of bubbles being detected must be separated one from the other by a space or absence of a bubble domain in order to be operable. In binary logic the absence of a bubble domain is identified as a "0" bit and the presence of a bubble domain is identified as a "1" bit. Since the bubbles in a bubble stream must be spaced out or delayed to be detected in an alternate bit detector, it has been suggested that continuous bit detectors be employed in bubble memory devices.

Alternate bit detectors employ two similar detector stages side by side, accordingly, these detector stages are subject to substantially the same environment and the signal-to-noise ratio does not produce a problem in detecting the difference between the presence of a bubble domain and the absence of a bubble domain.

Consecutive bit detectors of the type employed in the present invention employ similar detector stages. However, these detector stages are separated one from the other by a substantial distance on the device. Because of this separation of the detector stages, the magnetic field environment acting on the detector stage and the dummy detector stage may be so different that the signal-to-noise ratio sensed in the detector may cause the bubble memory device to be unusable.

It has been suggested that a high signal-to-noise ratio can be achieved in a consecutive bit detector even though the dummy detector stage is substantially removed from the detector stage by creating a substantially identical field at the two stages. Since the detector stage is a very small portion of a bubble chip, it is not practical to achieve this end by creating a separate external field or a modified external field which is operable only with the dummy detector stage.

It is not economically desirable to create two complete and separate detector arrays so that the dummy detector stage and the detector stage are subject to identical environments. Further, it would not be practical to duplicate the environment of the detector stage at the dummy detector stage by providing an array which was identical to the detector stage. Either of these proposed alternatives would require too much area on a bubble chip to be a practical solution. Further, there is no assurance that the two identical separated detector stages would create substantially identical field environments since the distance the detector stages would be separated one from the other may magnify the nonuniformities of the rotating field.

SUMMARY OF THE INVENTION

It is a principal object of the present invention to provide a novel detector array for a consecutive bit detector.

It is another object of the present invention to provide a detector having a detector stage and a dummy detector stage separated therefrom which has a high signal-to-noise ratio.

It is another object of the present invention to provide a high signal-to-noise ratio detector array having a minimum number of columns or stages thus reducing the area required on the bubble memory chip for the detector array.

It is another object of the present invention to provide a high signal-to-noise ratio detector array in which the detector stage and dummy detector stage are as close together as is practically possible.

It is yet another object of the present invention to provide means for laying out a detector array which eliminates trial and error in achieving a high signal-to-noise ratio operable device.

According to these and other objects of the present invention to be discussed in greater detail hereinafter, there is provided a detector array for a consecutive bit detector which comprises a plurality of chevron columns in a deep chevron array adapted to receive and contain a bubble stream. Following the deep chevron array is a magnetoresistor detector column which in turn is followed by a shallow stack of chevron columns adapted to receive and contain said bubble stream. Following the shallow stack of chevron columns and adjacent thereto is provided an isolated dummy detector array comprising a magnetoresistor dummy detector column bounded on one side by a plurality of leading chevron columns and a guard rail of chevron columns. The magnetoresistor dummy detector is bounded on the other side by a plurality of trailing chevron columns and a guard rail of chevron columns. The pattern of trailing chevron columns is substantially identical to said shallow stack of chevron columns and the pattern of leading chevron columns has a number of chevron columns which is substantially less than the number of chevron columns in the deep stack of chevron columns.

BRIEF DESCRIPTION OF THE DRAWINGS

The foregoing objects and advantages of the novel detector and its mode of operation will be made apparent from the detailed description of the accompanying drawings in which:

FIG. 1 is a section in elevation taken through the detector area of a bubble memory chip of the present invention;

FIG. 2 is a schematic plan view showing in block diagram the cooperation of the important elements of the present invention;

FIG. 3 is a schematic diagram of an alternate bit bubble detector array;

DESCRIPTION OF THE PREFERRED EMBODIMENT

Figure 4:
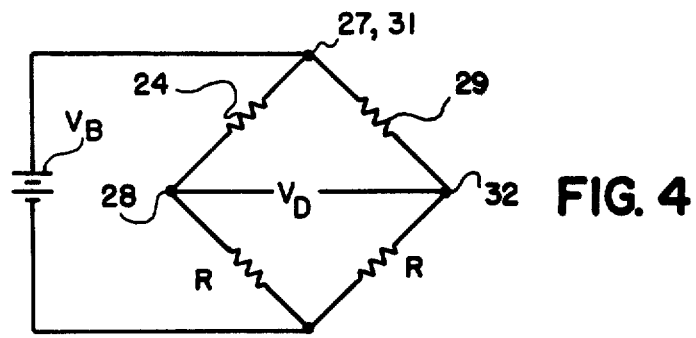
FIG. 4 is a schematic wiring diagram showing how the detector and dummy detector are wired in a bridge circuit to provide a sense signal.

FIG. 1 is a partial section in elevation taken through a bubble memory device in the detector area showing the substrate layer 11 preferably made of Gadolinium Gallium Garnet (GGG). The bubble film 12 comprises preferably a garnet layer. A spacer layer of silicon dioxide 13 is deposited on the layer 12 to support the permalloy detector pattern structure 14.

FIG. 2 is a schematic diagram showing the important elements of a chip 15 which comprises a bubble generator 16, a plurality of storage loops 17 and a detector 18. Superimposed on FIG. 2 is a diagramatic illustration of a rotating field $H_R$. It will be understood that the rotating field is separate and apart from the bubble memory chip 15 and is mounted in the close proximity thereof to produce an effective rotating field over the entire surface of the chip. It will be understood that under the effect of the rotating field $H_R$ that bubbles which have been generated in generator 16 and stored in storage loop 17 may be replicated or diverted out of a loop and introduced into detector 18 for being sensed therein. The rotating field $H_R$ covers the entire chip and all bubbles are propagated simultaneously.

FIG. 3 is typical of a prior art alternate bit detector which is provided with an expanding circuit. The chevron columns 19 and 21 of the expanding stage or stack shown are not complete and it will be understood that approximately fifteen such expanding columns may be employed. The number of chevrons in the final column of the expanding stage may be several hundred chevrons high. Chevron column 22 is shown to be the first column C1 of a deep stack of detector array 23 which comprises twenty-four chevron columns similar to column 22. A detector stage 24 is shown as column C25. An elongated bubble domain propagated in the direction shown by the arrow 26 will move through the detector stage 24 during the complete rotation the field $H_R$ and produce an output signal which may be sensed at the terminals 27 and 28. A dummy detector stage 29 shown as column C26 is provided to cancel the background magnetoresistive variations which occur in the absence of a bubble domain at the detector stage 24.

The bubble domain sensed at detector stage 24 is propagated through the dummy detector stage 29 and is annihilated by propagating it through a plurality of chevron column stages 29 to 33, shown as columns C26 to C30 terminating in a guard rail. The dummy detector stage 29 is provided with electrical terminals 31 and 32.

Figure 5:
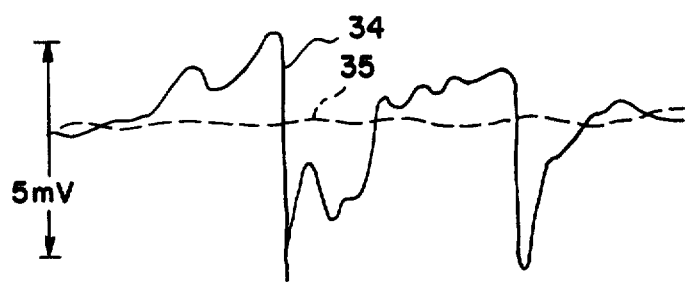
FIG. 5 is a typical prior art sensed bubble signal and superimposed in phantom lines is the no bubble signal.

Refer now to FIG. 4 showing how the detector stage 24 and dummy detector stage 29 are connected as magnetoresistor elements in a bridge circuit with balance resistors R for sensing the voltage signal produced by a bubble domain passing through the detector stage 24. The detector stage 24 and dummy detector stage 29 are connected in parallel in a bridge circuit with a series connected voltage supply source $V_B$ to provide a bridge output $V_D$. When the bubble domain representative of a binary digit "1" is passed through the detector stage 24, an output signal is produced at the voltage detector $V_D$ substantially as shown in FIG. 5 at curve 34. When no bubble domain is passed through the detector stage 24, the equivalent of a binary digit "0" is detected and the signal is substantially as shown by curve 35 of FIG. 5.

Referring to FIGS. 3 to 5 it will now be understood why the detector array of FIG. 3 is called an alternate bit detector. The arrangement of the dummy detector stage 29 in the bridge circuit of FIG. 4 cancels out the signal on the detector stage 24. Accordingly, if a bubble domain is sensed at detector stage 24 at the same time a bubble domain is being sensed on dummy detector stage 29, the two voltage signals would cancel each other and an erroneous signal would be produced representative of a binary "0" bit. Accordingly, the bits which are propagated in the detector array have been spaced out with alternate "0" bits between the significant digit bits.

Figure 6:
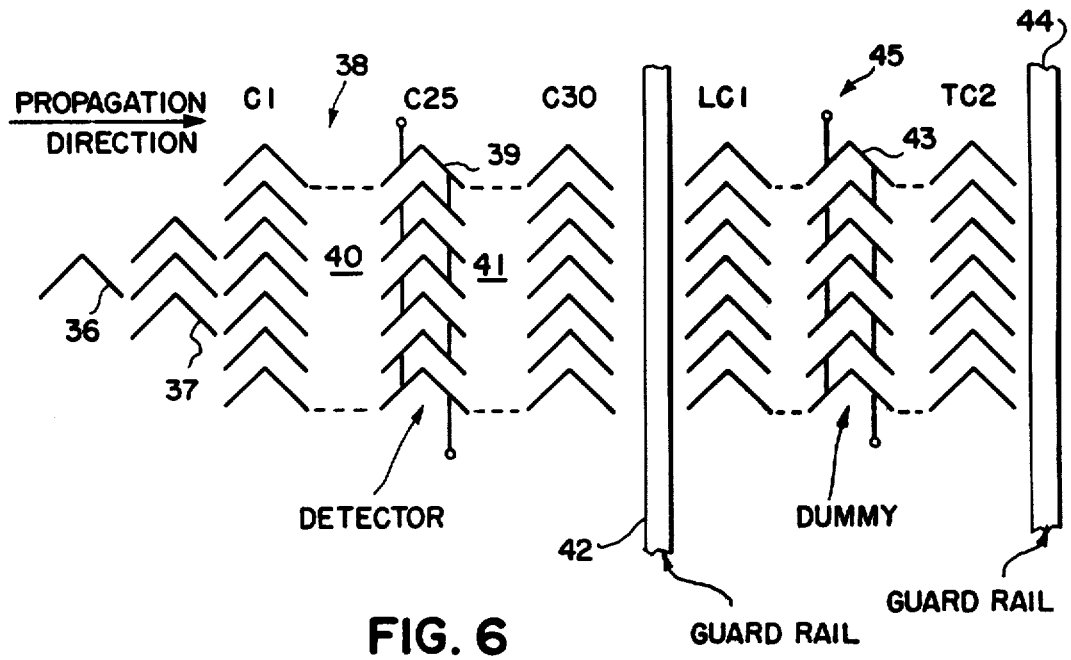
FIG. 6 is a schematic diagram of a typical consecutive bit detector of the type tested before modification.

Refer now to the consecutive bit detector schematically shown in FIG. 6. The expanding stages 36 and 37 may be identical to the expanding stages of an alternate bit detector described hereinbefore with reference to FIG. 3. For purposes of discussion of the present invention assume that the first 25 columns, C1 to C24, which comprise the deep chevron stack 40 of the detector array 38 are identical to the deep chevron stack of the detector array 23 of FIG. 3. Further, assume that the shallow chevron stack 41 which comprises columns C26 through C30 comprise the same number of columns of chevrons as the columns which follow the dummy detector stage 29 of FIG. 3. In FIG. 6 there are five columns following the detector stage 39 and in FIG. 3 there are five columns following the dummy detector stage 29.

A bubble stream entering the detector array 38 is sensed at detector stage 39 and passes through the shallow chevron stack 41 to be annihilated by the leading guard rail 42. The guard rail 42 serves to isolate dummy detector stage 43 from the bubble stream. The trailing guard rail 44 is provided to prevent stray bubbles from entering the dummy detector array 45. To further illustrate the principal of the present invention, there has been provided in addition to the guard rails 42 and 44, two leading columns LC1 and LC2 (not shown) and two trailing columns TC1 (not shown) and TC2.

Figure 7:
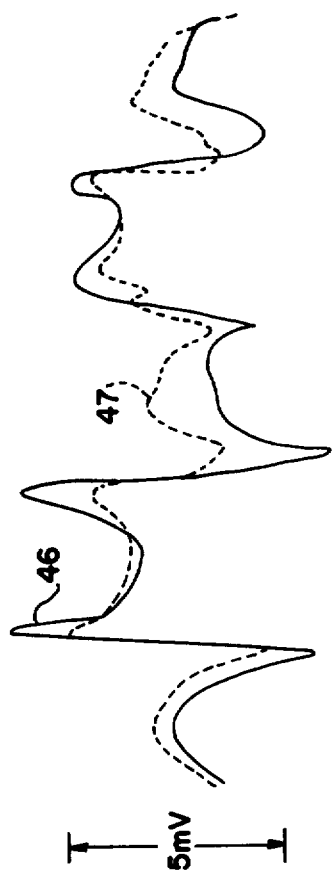
FIG. 7 is a typical sensed bubble signal of the type achieved with the consecutive bit detector shown in FIG. 6.

Refer now to FIG. 7 showing the typical sensed bubble output signal of the type achieved with a continuous bit detector of the type shown in FIG. 6. It will be noted that the curve 46 representative of the binary bit "1" and indicative of the presence of a bubble domain passing through detector stage 39 is substantially parallel to and followed by the phantom lines of curve 47. However, curve 47 is representative of a binary "0" which is indicative of the absence of a bubble domain at detector stage 39. It would be extremely difficult to provide a sensing circuit which would separate the binary "0" and binary "1" signals represented by curves 46 and 47 to distinguish between the two binary bits. Although there are regions in which the binary "1" can be distinguished from the binary "0", the sensed signals do not present practical signals which are reliable to operate a detector device.

Figure 8:
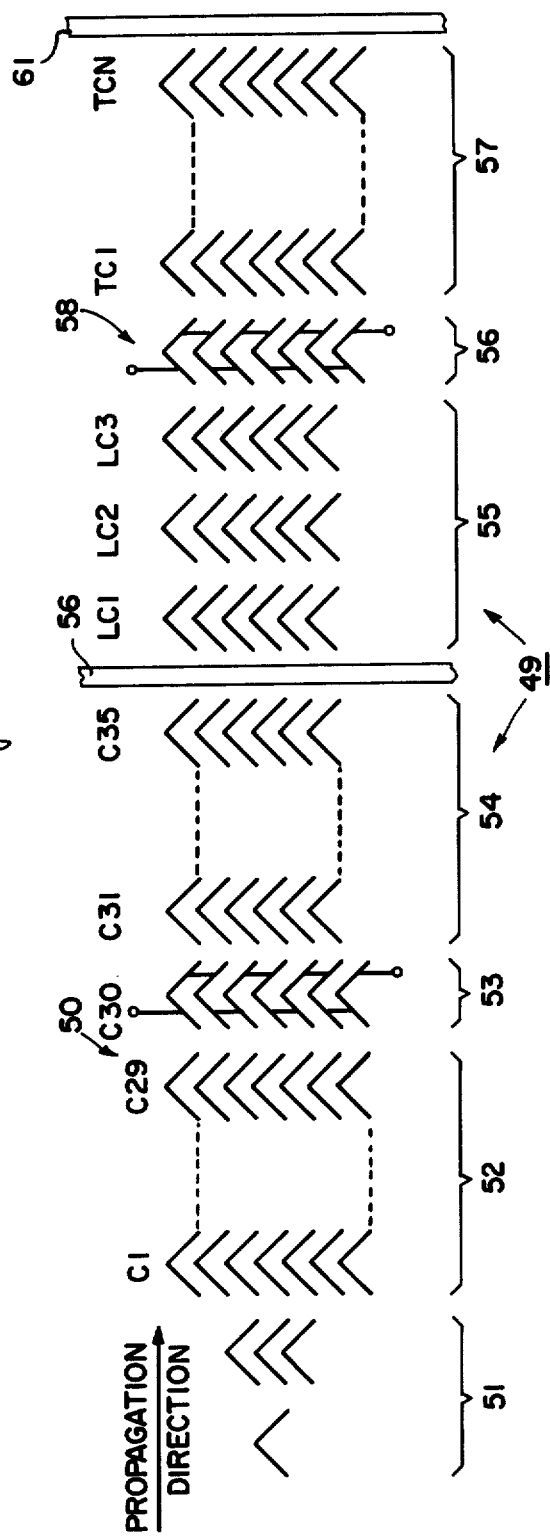
FIG. 8 is a schematic diagram of a preferred embodiment consecutive bit detector of the present invention.

Refer now to FIG. 8 showing a preferred embodiment of a continuous bit detector 49. The left hand portion of the detector 49 comprises the detector array having expanding stage 51, a deep chevron stack 52, a detector stage 53, and a shallow chevron stack 54. Detector 49 also comprises a dummy detector array 58 having a leading chevron stack 55, a dummy detector stage 56 and a trailing chevron stack 57. The dummy detector array 58 is bounded on either side by guard rails 56 and 61. It will be understood that the guard rails 56 and 61 may comprise inverted chevron columns substantially identical to columns LC1 through LC3. These columns are oriented to oppose the propagation of bubble domains leaving column C35. When the rotating field $H_R$ attempts to propagate bubble domains into the guard rail 56, the bubble domains will be annihilated. In similar manner the guard rail 61 attempts to propagate stray bubble domains into the trailing column TCN and the stray bubbles are destroyed.

It has been found that as few as three leading columns LC1 to LC3 in combination with five trailing columns TC1 to TC5 are sufficient to produce sensed output curves substantially identical to those shown in FIG. 5. It will be noted that there are twenty-nine chevron columns preceding the detector stage 53 and only three chevron columns preceding the dummy detector stage 56. Since these chevron columns may be as many as 400 chevrons high, there is a substantial saving on the chip area. More importantly, the physical location of the dummy detector stage is made much closer to the detector stage so that the variations in the rotating field are insignificant.

Further, it will be noted that the number of trailing chevron columns 57 following the detector stage 53. The results of the sensed output signal indicate that the number of trailing chevron columns 57 may be reduced by a slight amount. It is an object of the present invention to provide means for laying out a detector array which eliminates trial and error in achieving a high signal-to-noise ratio. Accordingly, by employing the identical number of chevron columns 57 following the dummy detector stage 56 as employed following the detector stage 53, the probability of error has been virtually eliminated. While it is understood that one chevron column may be saved the assurance of not having to lay out another detector is recommended. The saving of numerous chevron columns in the leading chevron columns 55 preceding the dummy detector stage 56 not only provides economies in saving area on the bubble chip, but further assures that the uniformity of the fields which effect the magnetoresistance of the dummy detector 56 and the detector 53 is enhanced.

Figure 9:
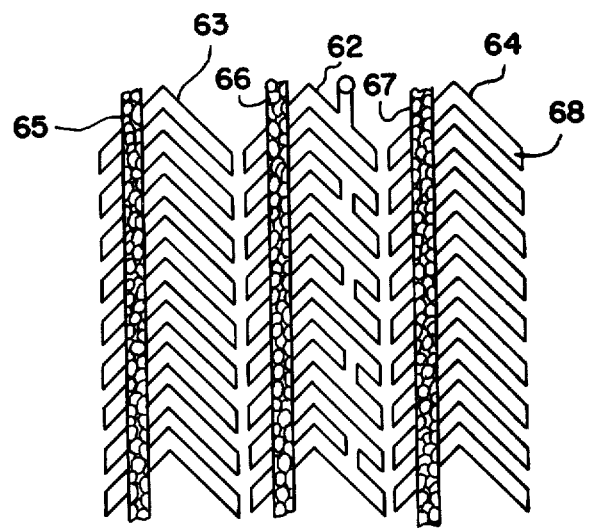
FIG. 9 is a schematic diagram of the detector stage of FIG. 8 and the two adjacent chevron columns illustrating the propagation of an elongated bubble domain through the detector stage.

Refer now to FIG. 9 showing a detector 62 having a leading chevron column 63 and a trailing chevron column 64 adjacent thereto. Superimposed on the pattern of chevron columns are elongated bubble domains 65, 66 and 67 representative of binary "1" bits being propagate through the chevron columns by a rotating field $H_R$.

Figure 10:
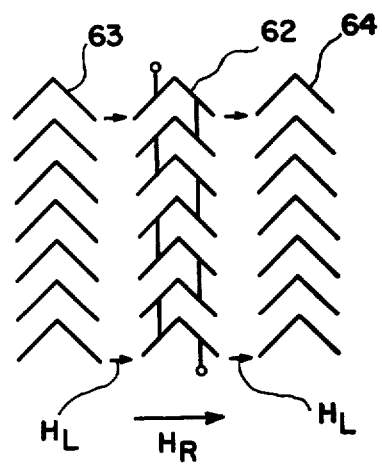
FIG. 10 is a schematic diagram of detector stage of FIG. 9 showing the magnetic fields which are acting on the detector stage which are similar to the fields acting on the the dummy detector stage.

FIG. 10 is a schematic representation of the chevron columns shown in FIG. 9. Assume that the rotating field $H_R$ is in the horizontal direction as shown which would cause the elongated bubble domains 65 through 67 to be at the extreme right ends of the chevrons at point 68 as shown in FIG. 9. When the direction of the magnetic field $H_R$ is as shown by the arrow in FIG. 10, the magnetization of the adjacent chevrons in the columns 63 and 64 acts to produce local fields $H_L$ which act in conjunction with the field $H_R$ to affect the magnetoresistive response of detector stage 62. Further, it will be understood that as the rotating field $H_R$ continues in the clockwise direction, the local field $H_L$ will be changed both in direction and magnitude. Both fields $H_L$ and $H_R$ may differ at the dummy detector stage.

Having explained a preferred embodiment continuous bit detector employing detectors and dummy detectors with chevron patterns, it will be understood that detectors having other patterns may be employed with equal success. Chevron patterns, cresent patterns, bar shaped patterns, etc, have been employed for propagation elements in their original and modified forms. Accordingly, the term chevron-like will be understood to embrace equivalent structures capable of propagating stripe domains. The pattern of chevrons employed for the bubble streams and the detector array and the dummy detector array are exemplary of a preferred embodiment pattern and substitutions of other patterns may produce substantially the same results. The present invention has been explained with regards to patterns and devices made with a thick film permalloy. Thick films of approximately 4,000 angstroms thickness have been found to be operable when employed with chevron columns approximately three microns wide and separated on centers of 20 microns. The preferred permalloy film is zero magnetostrictive comprising eighty-one percent nickel and nineteen percent iron.

I claim:

1. A detector for a consecutive bit bubble memory device of the type having a magnetoresistor detector and a dummy magnetoresistor detector comprising:
   - an expanding stack having a plurality of columns of propagation elements for receiving and expanding consecutive bit bubble stream,
   - a deep stack adjacent said expanding stack having a plurality of columns of propagation elements for receiving and containing said expanded bubble stream,
   - a magnetoresistor detector adjacent said deep stack adapted to change resistance as a bubble is propagated there through,
   - a shallow stack adjacent said detector having a plurality of columns of propagation element,
   - a first guard rail stack adjacent said shallow stack having a plurality of columns of anti-propagation elements for receiving and annihilating said bubble stream,
   - a dummy array comprising,
     - a leading propagation stack having a plurality of propagation columns, the number of said columns in said leading propagation stack being substantially smaller than the number of propagation columns in said deep stack, a dummy magnetoresistor detector adjacent said leading propagation stack, a trailing propagation stack adjacent said dummy detector having a plurality of columns of propagation elements, the number of said columns in said trailing propagation stack being substantially equal to the number of columns in said shallow stack, and a second guard rail stack adjacent said dummy array adapted to prevent stray bubbles from entering said dummy array.

2. A detector as set forth in claim 1 wherein the number of columns of propagation elements in said leading propagation stack is smaller than the number of columns of propagation elements in said trailing propagation stack.

3. A detector as set forth in claim 2 wherein the number of columns of propagation elements and said trailing propagation stack are equal to the number of columns of propagation elements in said shallow stack.

4. A detector as set forth in claim 1 wherein the number of columns of propagation elements in said trailing propagation stack is greater than three.

5. A detector as set forth in claim 4 wherein the number of columns of propagation elements in said leading propagation stack is greater than two.

6. A detector array as set forth in claim 1 wherein said propagation elements are chevron-like in shape.

7. A detector as set forth in claim 6 wherein all said elements in said detector are chevron-like in shape.

8. A detector as set forth in claim 1 wherein said guard rails each comprise three or more columns of propagation elements which are chevron-like in shape.

9. A detector as set forth in claim 8 wherein said magnetoresistor detectors comprise interconnected chevron-like shaped propagation elements.

10. A detector for a continuous bit bubble memory device comprising:

a detector array comprising a magnetoresistor detector, a deep stack and a shallow stack, a dummy detector array comprising a dummy magnetoresistor detector, a leading stack and a trailing stack positioned adjacent said detector array, first and second guard rails embracing said dummy detector array on either side, said trailing stack and said shallow stack having a plurality of columns of propagation elements which are substantially equal, and indicating means connected to said magnetoresistor detectors for indicating the presence or absence of a bubble being propagated through said magnetoresistor detector.

* * * * *